(12) United States Patent
Tao et al.

(10) Patent No.: US 11,933,824 B2
(45) Date of Patent: Mar. 19, 2024

(54) POWER MONITOR AND POWER MONITOR SYSTEM

(71) Applicants: Tyco Electronics (Shanghai) Co., Ltd., Shanghai (CN); TE Connectivity Services GmbH, Schaffhausen (CH)

(72) Inventors: Zongjie (Jason) Tao, Shanghai (CN); Dandan (Emily) Zhang, Shanghai (CN); Roberto Francisco-Yi Lu, Bellevue, WA (US)

(73) Assignees: Tyco Electronics (Shanghai) Co., Ltd., Shanghai (CN); TE Connectivity Solutions GmbH, Schaffhausen (CH)

( * ) Notice: Subject to any disclaimer, the term of this patent is extended or adjusted under 35 U.S.C. 154(b) by 24 days.

(21) Appl. No.: 17/701,043

(22) Filed: Mar. 22, 2022

(65) Prior Publication Data
US 2022/0308100 A1    Sep. 29, 2022

(30) Foreign Application Priority Data

Mar. 23, 2021 (CN) .......................... 202110310080.0

(51) Int. Cl.
*G01R 21/133* (2006.01)
*G01R 21/00* (2006.01)
*G01R 31/08* (2020.01)

(52) U.S. Cl.
CPC .......... *G01R 21/133* (2013.01); *G01R 31/086* (2013.01); *Y04S 10/30* (2013.01)

(58) Field of Classification Search
CPC ...... G01R 21/133; G01R 31/086; Y04S 10/30
See application file for complete search history.

(56) References Cited

U.S. PATENT DOCUMENTS

| 4,782,287 A * | 11/1988 | Marx ................. G01R 21/1273 340/637 |
| 6,097,182 A * | 8/2000 | Hemminger ......... G01R 21/133 324/142 |
| 10,132,846 B2 * | 11/2018 | Hurwitz ............... G01R 25/005 |
| 2003/0014200 A1 * | 1/2003 | Jonker ................. G01R 21/133 702/60 |
| 2004/0254750 A1 * | 12/2004 | Macfarlene ............ H05K 1/116 702/61 |

* cited by examiner

*Primary Examiner* — Jermele M Hollington
*Assistant Examiner* — Temilade S Rhodes-Vivour
(74) *Attorney, Agent, or Firm* — Barley Snyder

(57) ABSTRACT

A power monitor comprises a current/voltage transformer, an electric energy meter connected in series with the current/voltage transformer, and at least one current regulating element connected between the current/voltage transformer and the electric energy meter. The current/voltage transformer connects the electric energy meter to a load to monitor the electric energy consumed by the load by the electric energy meter. When a current flowing from the current/voltage transformer to the electric energy meter is greater than or equal to a threshold current, the at least one current regulating element reduces the current to less than a rated maximum current of the electric energy meter.

20 Claims, 3 Drawing Sheets

POWER MONITOR AND POWER MONITOR SYSTEM

CROSS-REFERENCE TO RELATED APPLICATIONS

This application claims the benefit of Chinese Patent Application No. 202110310080.0 filed on Mar. 23, 2021 in the State Intellectual Property Office of China, the whole disclosure of which is incorporated herein by reference.

FIELD OF THE INVENTION

Embodiments of the present disclosure relate to the field of power control, and more specifically, to a power monitor and a power monitor system having flexible, large range or multi range current/voltage sensing functions suitable for various loads.

BACKGROUND

Power monitoring is widely used in industrial production and residential life to monitor the electric energy consumed by various loads. Monitors usually use a current or voltage transformer to connect an electric energy meter to a load circuit. The current or voltage transformer converts the current or voltage from the load circuit into a value suitable for the measurement of the electric energy meter.

The current flowing through the electric energy meter usually has a certain working range. Current exceeding this range will lead to overload or underload of the power monitor and thus inhibit its operation. In order to measure the current/voltage in circuits with different loads, it is usually necessary to replace the current or voltage transformers to obtain appropriate converted current or voltage, which leads to an inconvenience. Further, as different current or voltage transformers have different current or voltage conversion ratios, accompanying software and/or hardware changes to power monitor or electric energy meter must also be made, which is both inconvenient and expensive for users to freely switch the power monitor between different loads.

SUMMARY

According to an embodiment of the present disclosure, a power monitor comprises a current/voltage transformer, an electric energy meter connected in series with the current/voltage transformer, and at least one current regulating element connected between the current/voltage transformer and the electric energy meter. The current/voltage transformer connects the electric energy meter to a load to monitor the electric energy consumed by the load. When a current flowing from the current/voltage transformer to the electric energy meter is greater than or equal to a threshold current, the at least one current regulating element reduces the current to less than a rated maximum current of the electric energy meter.

BRIEF DESCRIPTION OF THE DRAWINGS

The invention will now be described by way of example with reference to the accompanying Figures, of which.

DETAILED DESCRIPTION OF THE EMBODIMENTS

Figure 1:
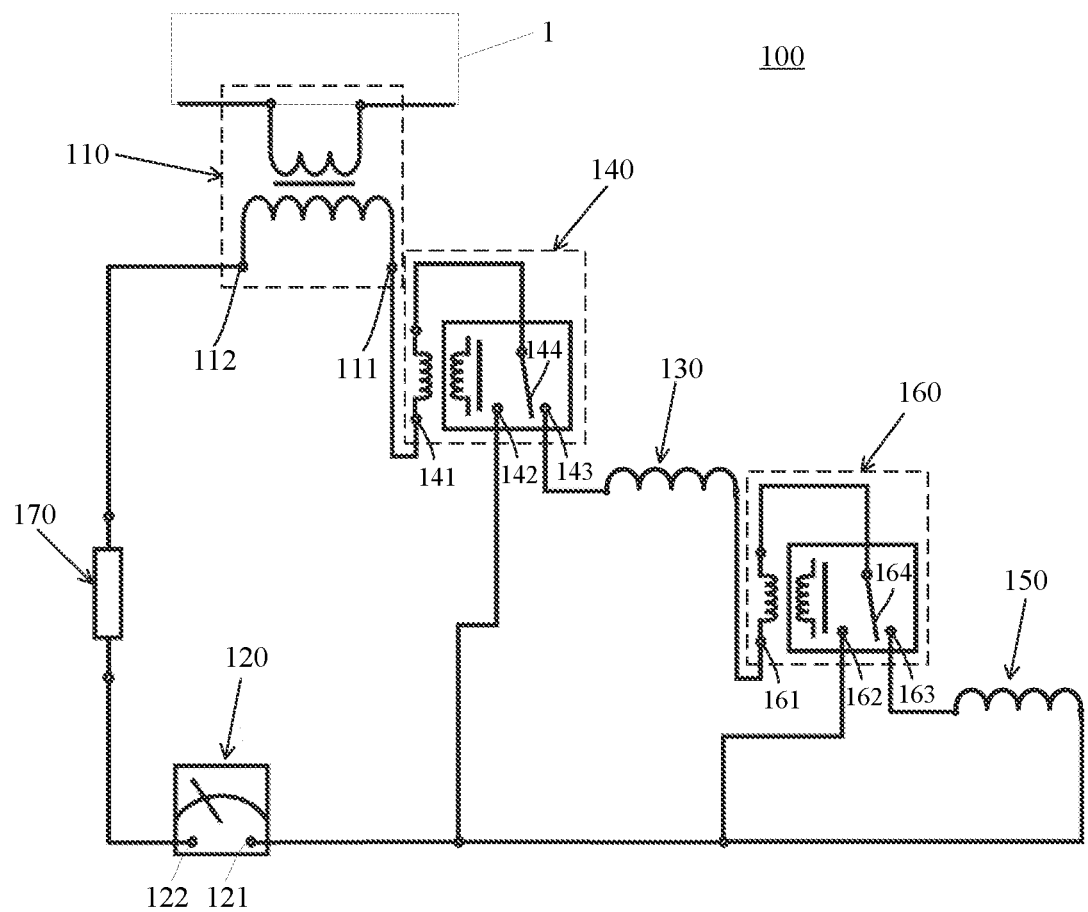
FIG. 1 is a circuit diagram schematically showing a power monitor according to an exemplary embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an embodiment of the present disclosure, a power monitor comprises a current/voltage transformer, an electric energy meter connected in series with the current/voltage transformer, and at least one current regulating element connected between the current/voltage transformer and the electric energy meter. The current/voltage transformer is used to connect the electric energy meter to a load to monitor the electric energy consumed by the load by the electric energy meter. When a current flowing from the current/voltage transformer to the electric energy meter is greater than or equal to a threshold current, the at least one current regulating element reduces the current to less than a rated maximum current of the electric energy meter.

According to embodiment of the present disclosure, a power monitor system comprises at least one power monitor as described above, with each power monitor for monitoring the electric energy consumed by the corresponding load. The system further includes at least one data transmission unit, each of which is connected with a corresponding power monitor to receive and transmit data signals related to the electric energy monitored by the power monitor. A database server is configured to receive the data signal from each data transmission unit and analyze the data signals through data fusion to obtain electric energy data associated with each load. A display device is configured to connect with a database server and display the obtained electric energy data.

As shown in FIG. 1, a power monitor 100 is provided according to an exemplary embodiment of the present disclosure, which can be used to monitor power or power consumption of a variety of different loads. The power monitor 100 includes a current/voltage (i.e., current and/or voltage, or current and voltage) transformer (CT/VT) 110 and an electric energy meter 120. The current/voltage transformer 110 is used to connect the electric energy meter 120 to load 1 and convert the current or voltage of the load 1 into a value suitable for the measurement of the electric energy meter. This value is within the working measuring range of the electric energy meter 120 such that the electric energy consumed by load 1 can be monitored by the electric energy meter.

The load 1 is connected to a primary side of the current/voltage transformer 110. The current/voltage transformer 110 and the electric energy meter 120 are connected in series, that is, the electric energy meter 120 is connected in series in a secondary side circuit of the current/voltage transformer 110. As shown in FIG. 1, the current/voltage transformer 110 has a first secondary side terminal 111 and a second secondary side terminal 112. The electric energy meter 120 has a first terminal 121 and a second terminal 122. The first terminal 121 is (as described below, indirectly, for example, via a switch element and/or a current regulating element) connected to the first secondary side terminal 111, and the second terminal 122 is (directly or indirectly, for example, via a resistor) connected to the second secondary side terminal 112, such that the electric energy meter 120 is connected in series to the secondary side of the current/voltage transformer 110.

In an exemplary embodiment of the present disclosure, the power monitor 100 also includes at least one current regulating element connected between the current/voltage transformer 110 and the electric energy meter 120. When a current flowing from the current/voltage transformer 110 to the electric energy meter 120 is greater than or equal to a threshold current, the power monitor 100 reduces the current to less than the rated maximum current of the electric energy meter 120 to avoid electric energy meter overload. It should be understood that although in most cases, the current regulating element is used to reduce the current flowing through the electric energy meter, in some embodiments, the current regulating element can also regulate (e.g., increase) the current converted by the current/voltage transformer. Therefore, when measuring different loads, there is no need to replace the current/voltage transformer. Through the current regulating element set inside the power monitor, the current in the secondary side circuit of the current/voltage transformer can be adjusted to the range suitable for the measurement of the electric energy meter.

The electric energy meter usually determines the current and voltage of the load based on the current/voltage conversion coefficient (such as current ratio or voltage ratio) of current/voltage transformers, and then determines the electric energy consumed by the load. According to the embodiment of the present disclosure, when the current regulating element is connected in series between the current/voltage transformer and the electric energy meter, the power monitor or its electric energy meter also determines the current converted from the load by the current/voltage transformer based on at least the current regulation coefficient of the current regulating element, and then determines and shows the electric energy consumed by the load. In the illustrated embodiment, at least one current regulating element includes an inductive element or inductor.

The power monitor may also include at least one switch element. Each switch element is configured to be turned on when the current flowing from the current/voltage transformer 110 to the electric energy meter 120 is greater than or equal to the threshold current, so as to connect a corresponding current regulating element in series between the current/voltage transformer 110 and the electric energy meter 120. The current regulating element will adjust (such as reduce) the current flowing in the secondary side circuit of the current/voltage transformer to a value within the range suitable for the measurement of the electric energy meter. In addition, in some examples, the switch element can also be turned on to connect the electric energy meter directly (i.e., not through the current regulating element) to ground or connect the electric energy meter indirectly (e.g., through resistance but not through the current regulating element) to the secondary side of the current/voltage transformer when the current flowing from the current/voltage transformer to the electric energy meter is less than the threshold current.

Each switch element has at least a first on-state and a second on-state. Each switch element is configured to be in the first on-state when the current flowing from the current/voltage transformer to the electric energy meter is less than the threshold current to establish a direct electrical connection between the current/voltage transformer and the electric energy meter (i.e., an electrical connection not via a current regulating element, but in some examples via a resistance, by way of non-limiting example). Further, each switch element is also configured to be switched to the second on-state when the current flowing from the current/voltage transformer to the electric energy meter is greater than or equal to the threshold current, so as to connect a corresponding current regulating element in series between the current/voltage transformer and the electric energy meter. In the illustrated embodiment, at least one switch element includes a relay.

As shown in FIG. 1, the at least one current regulating element includes a first current regulating element 130 and a second current regulating element 150, and the at least one switch element includes a first switch element 140 and a second switch element 160. The first switch element 140 is configured to connect the current regulating element 130 in series between the current/voltage transformer 110 and the electric energy meter 120 when the current flowing from the current/voltage transformer 110 to the electric energy meter 120 is greater than or equal to the first threshold current. In this case, only the first current regulating element 130 regulates the current flowing through the electric energy meter in the secondary side circuit of the current/voltage transformer 110. When the current flowing from the current/voltage transformer 110 to the electric energy meter 120 is greater than or equal to the second threshold current greater than the first threshold current, the first switch element 140 and the second switch element 160 connect the first current regulating element 130 and the second current regulating element 150 in series between the current/voltage transformer 110 and the electric energy meter 120. The first current regulating element 130 and the second current regulating element 150 jointly regulate the current flowing through the electric energy meter in the secondary side circuit of the current/voltage transformer.

Still referring to FIG. 1, taking the first current regulating element 130 and the second current regulating element 150 as inductors and the first switch element 140 and the second switch element 160 as relay, by way of example only, the first switch element 140 has a first access terminal 141, static contacts 142 and 143, and a movable contact 144, and the second switch element 160 has a second access terminal 161, static contacts 162 and 163. The first access terminal 141 of the first switch element 140 is connected to the first secondary side terminal 111 of the current/voltage transformer 110, the static contact 142 is connected to the first terminal 121 of the electric energy meter 120, the static contact 143 is connected to one end of the first current regulating element 130, the opposite end of the first current regulating element 130 is connected to the second access terminal 161 of the second switch element 160, and the static contact 162 is connected to the electric energy meter. The static contact 163 is connected to one end of the second current regulating element 150, the opposite end of the second current regulating element 150 is connected to the first terminal 121 of the electric energy meter 120, and the movable contact 164 is operably engaged with the static contact 162 or 163 according to the magnitude of the current flowing through the second switch element 160.

By way of example, the first switch element 140 is configured to be in the first on-state when the current flowing from the current/voltage transformer 110 to the electric energy meter 120 is less than the first threshold current, that is, the movable contact 144 contacts the static contact 142 to establish a direct electrical connection between the current/voltage transformer 110 and the electric energy meter 120 (i.e., an electrical connection not via a current regulating element, but in some examples may be via a resistance), so that the current flows from the current/voltage transformer 110 to the electric energy meter 120 through the first switch element 140. The first switch element 140 is also configured to be switched to the second on-state when the current flowing from the current/voltage transformer 110 to the electric energy meter 120 is greater than or equal to the first threshold current, that is, the movable contact 144 is switched from contact with the static contact 142 to contact with the static contact 143, so that the first current regulating element 130 is connected in series between the current/voltage transformer 110 and the electric energy meter 120. The first on-state of the first switch element can be referred to as the normally closed state.

The second switch element 160 is configured to be in the first on-state when the current flowing from the current/voltage transformer 110 to the electric energy meter 120 is less than the second threshold current, that is, the movable contact 164 contacts the static contact 162 so that the first current regulating element 130 is connected in series between the current/voltage transformer 110 and the electric energy meter 120 via the first switch element 140 and the second switch element 160, and the current regulating element 150 is disconnected from the current/voltage transformer 140. The second switch element 160 is further configured to be switched to the second on-state when the current flowing from the current/voltage transformer 110 to the electric energy meter 120 is greater than or equal to the second threshold current, so that the first current regulating element 130 and the second current regulating element 150 are connected in series between the current/voltage transformer 110 and the electric energy meter 120 via the first switch element 140 and the second switch element 160. The first on-state of the second switch element can also be referred to as the normally closed state.

In some embodiments, the first switch element and/or the second switch element may be in the first on-state when the power monitor is started and remain in the second on-state after being switched to the second on-state until the power monitor is restarted.

As shown in FIG. 1, the power monitor 100 may also include a resistance element 170 connected in series between the current/voltage transformer 110 and the electric energy meter 120, such as between the second secondary side terminal 112 of the current/voltage transformer 110 and the second terminal 122 of the electric energy meter 120. In other examples, the resistance element or other additional resistance may also be connected in series between the switch element and/or the current regulating element and the first secondary side terminal 121 of the electric energy meter.

Figure 2:
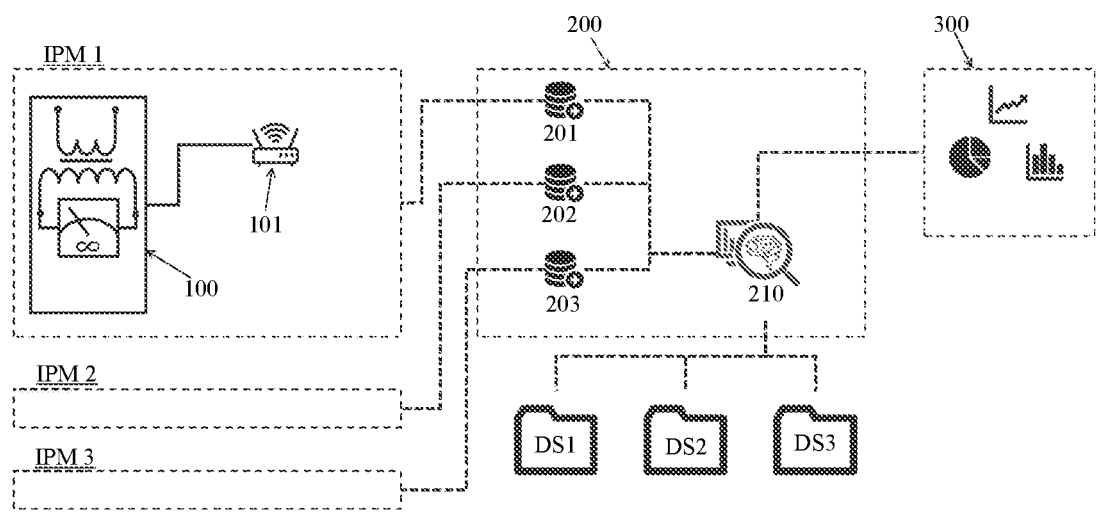
FIG. 2 is a schematic diagram showing a power monitor system according to an exemplary embodiment of the present disclosure.

According to an embodiment of the present disclosure, a power monitor system is also provided, which can be used for monitoring the energy consumption of a variety of loads in industrial production or a residential or commercial setting, such as monitoring the power consumption of various equipment in a factory or production line, or monitoring the energy consumption of various electrical equipment in an office or home. As shown in FIG. 2, the power monitor system includes at least one intelligent power monitoring unit IPM1, IPM2, IPM3, etc. Each intelligent power monitoring unit includes a power monitor 100 and a data transmission unit 101 connected to the power monitor 100. Each power monitor 100 is used to monitor the electric energy consumed by the corresponding load. Each data transmission unit 101 receives the electric energy data monitored by the corresponding power monitor 100 and transmits the data related to the electric energy data. The data transmission unit may include a wireless data transmitter or a wireless data transceiver.

Figure 3:
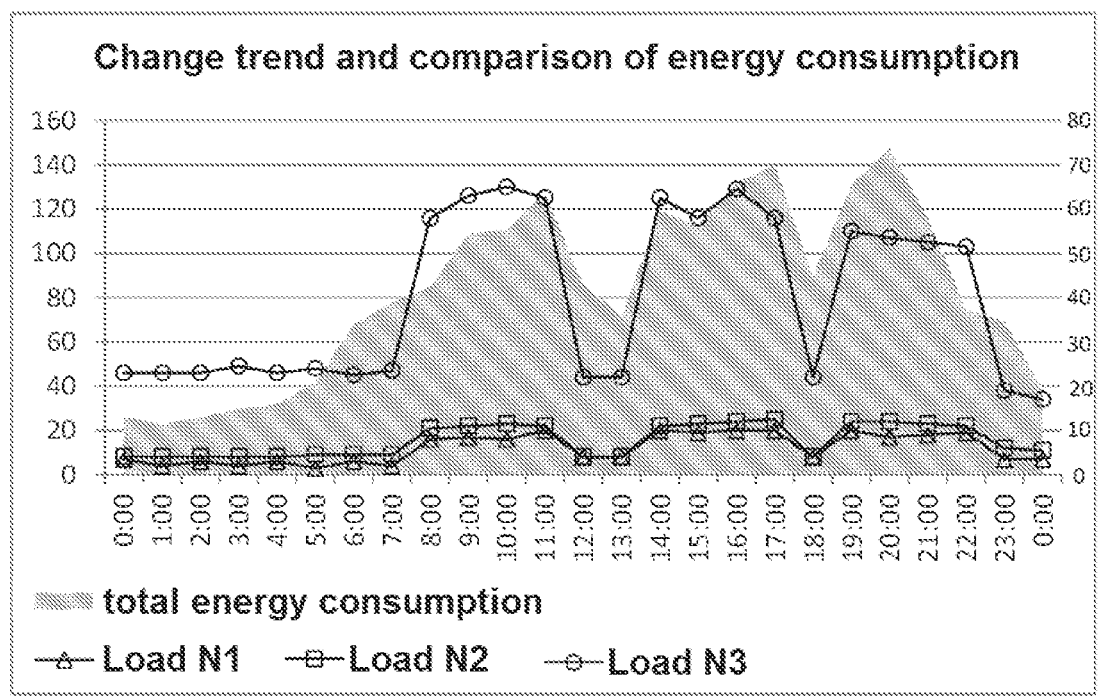
FIG. 3 is a graph schematically showing a changing trend of load energy consumption obtained by a power monitor or power monitor system according to an exemplary embodiment of the present disclosure.

The power monitor system may also include a database server 200 that receives the data signals from each data transmission unit 101 and analyzes the power data through data fusion or combination to obtain the fused power data associated with each load. As an example, the database server 200 may include at least one database 201, 202, 203, etc., and a data fusion module 210 (e.g., one or more processors), the database is used to store the electric energy data associated with one or more loads. The data fusion module 210 fuses or combines the electric energy data in each database, or can also receive external data from other sources DS1, DS2, DS3, etc., such as total energy consumption, power consumption time or production progress, so as to obtain the fused electric energy data. As shown in FIG. 3, the fused electric energy data can reflect, for example, the energy consumption change trend, offset, survival rate, production capacity, unit output value, etc. of each load. FIG. 3 schematically shows the changing trend of the electric energy consumed by the loads N1, N2 and N3. The power monitor system can also include a display device 300, such as a display of the user terminal, which can be connected with the database server and display the fused electric energy data to the user.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features.

Moreover, unless explicitly stated to the contrary, embodiments "comprising" or "having" an element or a plurality of elements having a particular property may include additional such elements not having that property.

What is claimed is:

1. A power monitor, comprising:
a current/voltage transformer;
an electric energy meter connected in series with the current/voltage transformer;
a first current regulating element and a second current regulating element connected between the current/voltage transformer and the electric energy meter, the current/voltage transformer connecting the electric energy meter to a load to monitor the electric energy consumed by the load, the monitor operative such that when a current flowing from the current/voltage transformer to the electric energy meter is greater than or equal to at least one of a first or a second threshold current, at least one of the first or the second current regulating elements reduces the current to less than a rated maximum current of the electric energy meter, and
a first switch element and a second switch element switch element, each switch element selectively connects a corresponding one of the first and second current regulating elements in series between the current/voltage transformer and the electric energy meter.

2. The power monitor according to claim 1, wherein each switch element has a first on-state and a second on-state, each switch element is adapted such that, when the current flowing from the current/voltage transformer to the electric energy meter is less than a respective one of the first or the second threshold currents current, the respective switch element is in the first on-state to establish a direct electrical connection between the current/voltage transformer and the electric energy meter.

3. The power monitor according to claim 2, wherein each switch element is adapted such that, when the current flowing from the current/voltage transformer to the electric energy meter is greater than or equal to a respective one of the first or the second threshold currents, the respective switch element is switched to the second on-state to connect the corresponding one of the first or second current regulating elements in series between the current/voltage transformer and the electric energy meter.

4. The power monitor according to claim 3, wherein the first switch element connects the first current regulating element in series between the current/voltage transformer and the electric energy meter when the current flowing from the current/voltage transformer to the electric energy meter is greater than or equal to the first threshold current.

5. The power monitor according to claim 4, wherein each of the first switch element and the second switch element connects the first current regulating element and the second current regulating element in series between the current/voltage transformer and the electric energy meter when the current flowing from the current/voltage transformer to the electric energy meter is greater than or equal to the second threshold current greater than the first threshold current.

6. The power monitor according to claim 5, wherein the first switch element is adapted such that, when the current flowing from the current/voltage transformer to the electric energy meter is less than the first threshold current, the first switch element is in the first on-state to establish a direct electrical connection between the current/voltage transformer and the electric energy meter.

7. The power monitor according to claim 6, wherein the first switch element is adapted such that, when the current flowing from the current/voltage transformer to the electric energy meter is greater than or equal to the first threshold current, the first switch element is switched to the second on-state to connect the first current regulating element in series between the current/voltage transformer and the electric energy meter.

8. The power monitor according to claim 7, wherein the second switch element is adapted such that, when the current flowing from the current/voltage transformer to the electric energy meter is less than the second threshold current, the second switch element is in the first on-state, so that the first current regulating element is connected in series between the current/voltage transformer and the electric energy meter via the first switch element and the second switch element, and the second current regulating element is disconnected from the current/voltage transformer.

9. The power monitor according to claim 8, wherein the second switch element is adapted such that, when the current flowing from the current/voltage transformer to the electric energy meter is greater than or equal to the second threshold current, the second switch element is switched to the second on-state, so that the first current regulating element and the second current regulating element are connected in series between the current/voltage transformer and the electric energy meter via the first switch element and the second switch element.

10. The power monitor according to claim 1, wherein each of the first switch element and the second switch element is in the first on-state when the power monitor is started.

11. The power monitor according to claim 10, wherein each of the first switch element and the second switch element is in the second on-state after being switched to the second on-state until the power monitor is restarted.

12. The power monitor according to claim 1, wherein the electric energy meter determines the current converted by the current/voltage transformer based on at least a current regulation coefficient of one of the first current regulating element or the second current regulating element when the at least one of the first current regulating element or the second current regulating element is connected in series between the current/voltage transformer and the electric energy meter.

13. The power monitor according to claim 1, wherein the first and second switch elements each include at least one switch a relay.

14. The power monitor according to claim 1, wherein each of the first and second the current regulating elements includes an inductive element.

15. The power monitor according to claim 1, further comprising a resistance element connected in series between the current/voltage transformer and the electric energy meter.

16. A power monitor system, comprising:
at least one power monitor, each power monitor including:
a current/voltage transformer;
an electric energy meter connected in series with the current/voltage transformer;
a first current regulating element and a second current regulating element connected between the current/voltage transformer and the electric energy meter, the current/voltage transformer connecting the electric energy meter to a load to monitor the electric energy consumed by the load, when a current flowing from the current/voltage transformer to the electric energy meter is greater than or equal to a threshold current, at least one of the first or the second current regulating elements reduces the current to less than a rated maximum current of the electric energy meter, each power monitor for monitoring the electric energy consumed by the corresponding load; and a first switch element and a second switch element switch element, each switch element selectively connects a corresponding one of the first and second current regulating elements in series between the current/voltage transformer and the electric energy meter;

at least one data transmission unit, each connected with a corresponding power monitor to receive and transmit data signals related to the electric energy monitored by the power monitor;

a database server receiving the data signal from each data transmission unit and analyzing the data signals through data fusion to obtain electric energy data associated with each load; and a display device connecting with a database server and displaying the obtained electric energy data.

17. The power monitor system according to claim 16, wherein the at least one data transmission unit includes a wireless data transmitter.

18. The power monitor system according to claim 16, further comprising a data fusion module combining electrical energy data and generating fused energy data indicative of a characteristic of each load.

19. A power monitor, comprising:
a current/voltage transformer;
an electric energy meter connected in series with the current/voltage transformer, the current/voltage transformer connecting the electric energy meter to a load to monitor the electric energy consumed by the load;

a first switch element switchable between a first state and a second state, in the first state the first switch connecting the current/voltage transformer directly to the electric energy meter; and a first current regulating element including a first inductor arranged in series between an output of the first switch element and the electric energy meter, wherein in the second state, the first switch element connects the first current regulating element in series with the current/voltage transformer and the electric energy meter, the first switch element switching from the first state to the second state when a current flowing from the current/voltage transformer is greater than or equal to a first threshold current, the first current regulating element reducing the current to less than a rated maximum current of the electric energy meter.

20. The power monitor according to claim 19, further comprising:

a second switch element switchable between a first state and a second state, in the first state the second switch connecting the output of the first inductor directly to the electric energy meter; and a second current regulating element including a second inductor arranged in series between an output of the second switch element and the electric energy meter, wherein in the second state, the second switch element connects the first and the second current regulating elements in series with the current/voltage transformer and the electric energy meter, the second stitch element switching from the first state to the second state when a current flowing from the current/voltage transformer is greater than or equal to a second threshold current, the second current regulating element reducing the current to less than the rated maximum current of the electric energy meter.

\* \* \* \* \*